(12) United States Patent
Kaempf et al.

(10) Patent No.: US 10,115,869 B2
(45) Date of Patent: Oct. 30, 2018

(54) OPTOELECTRONIC SEMICONDUCTOR CHIP, OPTOELECTRONIC COMPONENT AND METHOD FOR SINGULATING SEMICONDUCTOR CHIPS

(71) Applicant: OSRAM Opto Semiconductors GmbH, Regensburg (DE)

(72) Inventors: Mathias Kaempf, Burglengenfeld (DE); Simon Jerebic, Tegernheim (DE); Ingo Neudecker, Regensburg (DE); Guenter Spath, Regensburg (DE); Michael Huber, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 17 days.

(21) Appl. No.: 15/030,359

(22) PCT Filed: Oct. 14, 2014

(86) PCT No.: PCT/EP2014/072010
§ 371 (c)(1),
(2) Date: Apr. 18, 2016

(87) PCT Pub. No.: WO2015/055647
PCT Pub. Date: Apr. 23, 2015

(65) Prior Publication Data
US 2016/0254415 A1    Sep. 1, 2016

(30) Foreign Application Priority Data

Oct. 18, 2013   (DE) .................. 10 2013 111 503

(51) Int. Cl.
*H01L 33/00* (2010.01)
*H01L 33/48* (2010.01)
(Continued)

(52) U.S. Cl.
CPC ............ *H01L 33/486* (2013.01); *H01L 24/32* (2013.01); *H01L 33/0095* (2013.01);
(Continued)

(58) Field of Classification Search
CPC ..... H01L 33/0095; H01L 33/20; H01L 33/22; H01L 2924/10156
See application file for complete search history.

(56) References Cited

U.S. PATENT DOCUMENTS 5,923,995 A * 7/1999 Kao .................... B81C 1/00888
438/460
6,531,405 B1 * 3/2003 Wegleiter ............ H01L 31/0236
257/E31.13
(Continued)

FOREIGN PATENT DOCUMENTS

DE         10245930 A1    4/2004
DE     102005053274 A1    4/2007
(Continued)

*Primary Examiner* — Ismail Muse
(74) *Attorney, Agent, or Firm* — McDermott Will & Emery LLP (57) ABSTRACT

The invention relates to an optoelectronic semiconductor chip (10) comprising a carrier (2) and a semiconductor body (1) having an active layer (13) provided for generating electromagnetic radiation. Said carrier (2) has a first main surface (2A) facing the semiconductor body, a second main surface (2B) facing away from the semiconductor body, and a sidewall (2C) arranged between the first main surface and the second main surface. The carrier (2) has a structured region (21, 22, 23, 2C) for enlarging the total surface area of the sidewall, wherein the structured region has singulation traces. The invention also relates to an optoelectronic component (100) comprising such a semiconductor chip and a method for producing a plurality of such semiconductor chips are specified.

9 Claims, 6 Drawing Sheets

(51) Int. Cl.
 H01L 33/20 (2010.01)
 H01L 23/00 (2006.01)
 H01L 33/54 (2010.01)
 H01L 33/56 (2010.01)
 H01L 33/60 (2010.01)
 H01L 33/62 (2010.01)
(52) U.S. Cl.
 CPC .............. *H01L 33/20* (2013.01); *H01L 33/54* (2013.01); *H01L 33/56* (2013.01); *H01L 33/60* (2013.01); *H01L 33/62* (2013.01); *H01L 2224/73265* (2013.01); *H01L 2924/10156* (2013.01); *H01L 2933/0033* (2013.01)

(56) References Cited

U.S. PATENT DOCUMENTS

| | | | | |
|---|---|---|---|---|
| 7,446,344 | B2* | 11/2008 | Fehrer | H01L 33/20 257/95 |
| 8,951,915 | B2* | 2/2015 | Hess | H01L 21/30655 257/E29.002 |
| 9,385,272 | B2* | 7/2016 | Chen | H01L 33/38 |
| 2003/0190770 | A1 | 10/2003 | Yeom et al. | |
| 2004/0026700 | A1 | 2/2004 | Akaike et al. | |
| 2004/0056260 | A1* | 3/2004 | Slater, Jr. | H01L 33/20 257/79 |
| 2007/0145883 | A1* | 6/2007 | Ohashi | H01L 33/20 313/498 |
| 2008/0061307 | A1* | 3/2008 | Ikeda | H01L 33/22 257/94 |
| 2008/0128716 | A1* | 6/2008 | Tazima | H01L 33/20 257/88 |
| 2008/0315232 | A1* | 12/2008 | Matsuo | H01L 33/46 257/98 |
| 2010/0006881 | A1* | 1/2010 | Seo | H01L 33/0079 257/98 |
| 2011/0198665 | A1* | 8/2011 | Furukawa | H01L 33/20 257/100 |
| 2011/0297999 | A1* | 12/2011 | Binder | H01L 33/54 257/99 |
| 2012/0261693 | A1* | 10/2012 | Chen | H01L 33/642 257/98 |
| 2012/0267656 | A1* | 10/2012 | Kuo | H01L 31/02363 257/98 |
| 2013/0015481 | A1 | 1/2013 | Yoshimura et al. | |
| 2013/0087823 | A1* | 4/2013 | Tsai | H01L 33/38 257/98 |
| 2013/0234193 | A1* | 9/2013 | Odnoblyudov | H01L 33/0095 257/99 |
| 2014/0117389 | A1* | 5/2014 | Lee | H01L 33/38 257/98 |
| 2015/0008466 | A1* | 1/2015 | Bierhuizen | H01L 33/0095 257/98 |
| 2015/0072092 | A1* | 3/2015 | Seo | C09K 11/883 428/36.91 |
| 2016/0211180 | A1* | 7/2016 | Takahashi | H01L 21/6836 |
| 2016/0268164 | A1* | 9/2016 | Matsui | H01L 21/467 |

FOREIGN PATENT DOCUMENTS

| | | |
|---|---|---|
| DE | 202010000518 U1 | 8/2011 |
| EP | 1592074 | 11/2005 |
| WO | 2004/032247 A2 | 4/2004 |

\* cited by examiner

OPTOELECTRONIC SEMICONDUCTOR CHIP, OPTOELECTRONIC COMPONENT AND METHOD FOR SINGULATING SEMICONDUCTOR CHIPS

The application relates to an optoelectronic semiconductor chip, an optoelectronic component and a method for singulating semiconductor chips.

A conventional optoelectronic component can comprise a semiconductor chip and a casting compound, wherein the semiconductor chip is embedded into the casting compound. Poor adhesion of the casting compound to the semiconductor chip can lead to inadequate mechanical stability between the semiconductor chip and the casting compound.

It is an object to increase the mechanical stability and the service life of an optoelectronic component comprising an optoelectronic semiconductor chip. It is a further object to provide a method for singulating such semiconductor chips.

These objects are achieved inter alia by an optoelectronic semiconductor chip and a method for singulating such semiconductor chips in accordance with the independent claims. Further embodiments and developments are described in the dependent claims.

According to at least one embodiment of an optoelectronic semiconductor chip, said semiconductor chip comprises a carrier and a semiconductor body. The semiconductor body is arranged on the carrier. The carrier can be a growth substrate, on which the semiconductor layers are deposited in layers in an epitaxial manner. Alternatively, the carrier can be different from a growth substrate. In particular, the semiconductor chip in this case is free of a growth substrate.

The semiconductor body can comprise a plurality of semiconductor layers. In particular, the semiconductor body contains an active layer which generates electromagnetic radiations during operation of the semiconductor chip. The active layer is arranged e.g. between a first semiconductor layer and a second semiconductor layer. In particular, the active layer is a p-n junction zone. The active layer can be formed with a single layer or with multiple layers. In particular, the semiconductor body contains merely semiconductor layers. The semiconductor body comprises a lateral surface which can be directed perpendicularly or obliquely with respect to a main extension plane of the active layer.

According to at least one embodiment of the semiconductor chip, the carrier comprises a first major surface facing towards the semiconductor body and a second major surface facing away from the semiconductor body. For example, the semiconductor body is defined in the vertical direction by the first major surface and by the second major surface. A vertical direction is understood to be a direction which is directed perpendicularly with respect to the main extension plane of the active layer. In particular, the vertical direction is directed in parallel with a growth direction of the semiconductor layers.

According to at least one embodiment of the semiconductor chip, the carrier comprises a side flank between the first major surface and the second major surface. In particular, the carrier is defined in the lateral direction by the side flank. A lateral direction is understood to be a direction which is directed in parallel with the main extension plane of the active layer. The lateral direction and the vertical direction are orthogonal with respect to one another. In particular, the side flank of the carrier and the lateral surface of the semiconductor body together form a lateral surface of the semiconductor chip.

According to at least one embodiment of the semiconductor chip, the carrier comprises a structured region for enlarging a total surface area of the side flank. The structured region can be a continuously structured side flank or local depressions or elevations on the side flank of the carrier. A structured side flank is understood to be a side flank which comprises in particular local elevations or local depressions, for instance indentations or projections. In addition or alternatively, the side flank can be formed obliquely with respect to the major surfaces of the carrier or can be globally curved, for instance globally convexly or concavely curved. Surfaces comprising levels of roughnesses which, within the scope of production tolerances, are produced randomly or unavoidably by a production method do not form part of a region of the carrier described in this case which is structured in a targeted manner.

According to at least one embodiment of the semiconductor chip, the side flank, in particular the structured region of the carrier, comprises singulating traces. For example, the side flank comprises singulating traces at the structured locations, for instance on the elevations, depressions or along the oblique or curved portions of the side flank. The entire side flank can also comprise singulating traces between the first major surface and the second major surface. Singulating traces are to be understood to be process-typical traces from a process of singulating the semiconductor chips, for instance typical traces from an etching process for singulating semiconductor chips. If the structured locations of the side flank comprise singulating traces, this is evidence in particular of the fact that the side flank is already structured during singulation and the structuring is effected in particular by the singulation method. In particular, the entire side flank of the carrier comprises the same process-typical singulation traces.

In at least one embodiment of the optoelectronic semiconductor chip, said semiconductor chip comprises a carrier and a semiconductor body. The semiconductor body contains an active layer which generates an electromagnetic radiation during operation of the semiconductor chip. The carrier comprises a first major surface facing towards the semiconductor body and a second major surface facing away from the semiconductor body. The carrier comprises a side flank between the first major surface and the second major surface. The carrier comprises a structured region for enlarging a total surface area of the side flank, wherein the structured region comprises singulating traces.

If the carrier comprising the structured region, for instance a structured side flank, is surrounded e.g. by a casting compound, a boundary surface between the semiconductor chip and the casting compound increases in size, so that the mechanical stability of a composite of the semiconductor chip and the casting compound is increased. Furthermore, with regard to the structured side flank the carrier forms in particular an anchoring structure for the casting compound, so that the casting compound can engage into the anchoring structure and become anchored to the semiconductor chip, whereby the mechanical stability of the composite is additionally increased. If the side flank comprises local depressions or local elevations and/or if the side flank of the carrier is curved or oblique relative to the major surfaces, a displacement of the semiconductor chip relative to the casting compound, which can lead to losses in the operating capacity or even to the failure of the optoelectronic device—for instance if a bond wire becomes detached from a contact point by reason of the displacement—can be substantially prevented.

According to at least one embodiment of the semiconductor chip, the structured region is formed as a barrier groove, which is circumferential with respect to the carrier, on the side flank. In particular, the barrier groove is a depression, for instance a circumferential depression closed in the lateral direction, in the carrier. The barrier groove has a lateral extent which is between 3 μm and 60 μm inclusive, in particular between 4 μm and 30 μm inclusive, for instance between 5 μm and 15 μm inclusive. The lateral extent of the barrier groove is, in particular, a lateral width of the depression in the carrier. The side flank can comprise a plurality of barrier grooves.

The barrier groove is spaced apart e.g. from the first major surface and from the second major surface. In particular, a vertical spacing between the barrier groove and the first major surface is smaller, for instance at least 30% smaller, than a vertical spacing between the barrier groove and the second major surface. In addition or alternatively, the side flank can comprise a barrier groove whose vertical spacing with respect to the first major surface is larger, for instance at least 30% larger, than a vertical spacing between the barrier groove and the second major surface.

According to at least one embodiment of the semiconductor chip, the structured region is formed as an indentation on the side flank. In particular, the indentation is a lateral notch in the carrier. For example, the indentation has a lateral width which is between 0.3 μm and 6 pm inclusive, in particular between 0.5 μm and 3 μm inclusive. The lateral width of the indentation is, in particular, a maximum lateral extent of the indentation.

According to at least one embodiment of the semiconductor chip, the lateral extent of the barrier groove is at least twice and at the most 10 times, for instance at least 3 times and at the most 5 times, as large as the lateral width of the indentation.

According to at least one embodiment of the semiconductor chip, the indentation has a vertical depth which is between 1 μm and 18 μm inclusive. In particular, the vertical depth is between 2 μm and 12 μm inclusive, for instance between 3 μm and 8 μm inclusive. The vertical depth of the indentation is, in particular, a maximum vertical extent of the indentation.

According to at least one embodiment of the semiconductor chip, the vertical depth of the indentation is at the most 5 times, in particular at the most 3 times, the lateral width of the indentation. In particular, the vertical depth is at least precisely as large as the lateral width of the indentation. Such an indentation on the side flank can be formed e.g. in a simplified manner by targeted etching during the singulation of the semiconductor chips.

According to at least one embodiment of the semiconductor chip, the indentation is completely circumferential with respect to the carrier in the lateral direction. Such an indentation prevents casting materials or adhesives from creeping in particular to a radiation exit surface of the semiconductor chip.

According to at least one embodiment of the semiconductor chip, the side flank comprises a plurality of indentations. In particular, the indentations are spaced apart from one another in the vertical direction.

According to at least one embodiment of the semiconductor chip, the side flank comprises one projection. The projection is formed in particular in the vertical direction between two adjacent indentations. In particular, the projection comprises singulating traces. The side flank of the carrier can comprise a plurality of projections.

According to at least one embodiment of the semiconductor chip, the structured region is the entire side flank. The side flank of the carrier is globally concavely curved or globally convexly curved e.g. along the vertical direction. In particular, the side flank of the carrier—apart from the indentations and projections which can be considered to be local depressions or local elevations respectively—are globally concavely or convexly curved. The indentations and projections of the side flank can thus be considered to be microscopic structures of the side flank. The side flank is globally concavely or convexly curved if said side flank, when viewed in particular macroscopically, is concavely or convexly curved. In other words, the side flank can comprise a globally convex or globally concave basic shape, wherein indentations or projections can be provided in this basic shape. The side flank of the carrier can also be formed to be free of the indentations or projections.

The first major surface has a first maximum extent and the second major surface has a second maximum extent. For example, the first and second maximum extent are a diameter or an edge length of the first or second major surface. In the case of a globally convexly curved side flank, the carrier has, at a vertical location between the first major surface and the second major surface, a third maximum lateral extent which corresponds to the first and second maximum extent and is larger than the first maximum extent and larger than the second maximum extent. In the case of a globally concavely curved side flank, the third maximum lateral extent is smaller than the first maximum extent and smaller than the second maximum extent.

For example, the third maximum lateral extent differs from the first maximum extent or from the second maximum extent by a length which is between 5 times and 50 times inclusive, preferably between 5 times and 20 times inclusive, the lateral width of the indentation. In particular, the third maximum lateral extent differs from the first or from the second maximum extent by at least 3 μm, e.g. by at least 8 μm, for instance by at least 20 μm.

According to at least one embodiment of the semiconductor chip, the first major surface and the second major surface comprise cross-sections of a different size as seen in plan view. The first major surface can be larger or smaller than the second major surface. For example, the first maximum extent of the first major surface differs from the second maximum extent of the second major surface by at least 5 times, in particular by at least 20 times or by at least 50 times, the lateral width of the indentation. In particular, the first maximum extent differs from the second maximum extent by at least 3 μm, e.g. by at least 8 μm, for instance by at least 20 μm.

According to at least one embodiment of the semiconductor chip, the side flank of the carrier is formed in an oblique manner with respect to the major surfaces of the carrier. In particular, the side flank together with the second major surface or the first major surface forms an inner acute angle. An inner acute angle is understood to be an angle situated within the carrier. The first and the second major surface are, in particular, in parallel with one another. The obliquely formed side flank of the carrier can be free of the indentations or projections.

According to at least one embodiment of an optoelectronic component, said component comprises a semiconductor chip and a casting compound. For example, the semiconductor chip is completely surrounded in the lateral direction by the casting compound. The casting compound engages in particular into the structured region of the carrier and covers at least regions of the side flank.

According to at least one embodiment of the component, said component comprises a housing. The housing contains e.g. a cavity in which the semiconductor chip and the casting compound are arranged in such a manner that the casting compound laterally surrounds the semiconductor chip. As seen in plan view, the casting compound covers the semiconductor chip, in particular, completely.

According to at least one embodiment of the component, the casting compound comprises a first radiation-reflecting partial layer. The first partial layer surrounds the carrier in the lateral direction. In particular, the active layer is free of the first partial layer, as seen in plan view. Electromagnetic radiation which is generated by the active layer during operation of the semiconductor chip can be deflected at the first partial layer in a specified vertical emission direction, so that the radiation out-coupling from the radiation exit surface of the component can be increased.

According to at least one embodiment of the component, the structured region comprises a barrier groove which is circumferential with respect to the carrier. The barrier groove is formed in particular as a separating barrier for the first partial layer, so that the first partial layer fills the cavity of the housing at the most as far as including the barrier groove. The barrier groove can prevent a material, for instance a reflective casting material, from creeping onto a vertical height of the active layer or even onto the radiation exit surface of the semiconductor chip.

In one embodiment of a method for singulating a composite consisting of a carrier substrate and a semiconductor layer sequence comprising an active layer, which is provided for generating electromagnetic radiation, into a plurality of optoelectronic semiconductor chips, the composite is initially provided. A trench is formed, so that the trench extends into the carrier substrate. The trench can extend partially or completely through the carrier substrate. The carrier substrate is structured in a targeted manner to enlarge a total surface area of a side flank of the semiconductor chips, which are to be singulated, during formation of the trench. The singulated semiconductor chips each comprise a semiconductor body with the active layer and comprise a carrier with the side flank from the carrier substrate, wherein the carrier comprises a region which is structured to enlarge the side flank and has singulating traces.

In particular, the trench is defined, during formation thereof, in a lateral direction by means of a structured side flank. In particular, the side flank comprises singulating traces. A plurality of trenches can also be formed, wherein the trenches can each be defined by structured side flanks. The composite is singulated by the trench or by the plurality of trenches into a plurality of semiconductor chips.

According to at least one embodiment of the method, the composite consisting of the semiconductor layer sequence and the substrate is arranged on a flexible carrier film prior to singulation. The carrier film is formed so as to be stretchable in particular in the lateral direction, so that the semiconductor chips can be singulated in a simplified manner. Furthermore, the semiconductor chips are present, after singulation, on the flexible carrier film, whereby further processing of the semiconductor chips in a subsequent process step can be simplified.

According to at least one embodiment of the method, the trench is formed by a dry-chemical singulation method. Structuring of the carrier substrate is produced, in particular during formation of the trench, by varying at least one parameter of the singulation method in a targeted manner.

According to at least one embodiment of the method, a plasma singulation method is applied in order to singulate the semiconductor chips. In order to form different shapes of the trench and thus a different geometry of the side flank of the carrier, at least one parameter of the singulation method is varied in a targeted manner during singulation. The variation of the parameter can be e.g. a controlled change in the gas flows or etching time in a targeted manner.

By means of such a singulation method, in particular by varying the parameters of the singulation method in a targeted manner, the side flank of the carrier can be enlarged in a targeted manner with respect to a side flank which extends in a linear manner in the vertical direction and which is singulated for instance in a conventional manner by sawing or by laser. The enlargement of the side flank and the change in the side flank geometry which e.g. is different from the geometry of a side flank, which extends linearly and perpendicularly with respect to a major surface of the carrier, lead to improved heat dissipation and to improved adhesion e.g. of casting materials on the lateral surface of the semiconductor chip. In the case of volume emitters, e.g. in the case of semiconductor chips based on GaAs, wherein in particular at least 30% of the radiation generated by the active layer exits through a lateral surface of the semiconductor chip, the semiconductor chip surface can be enlarged in a targeted manner, whereby an increased luminous efficiency is achieved.

According to at least one embodiment of the method, an etching mask is used in the plasma singulation method. The etching mask can be a masking layer which is applied to a surface of the semiconductor layer sequence facing away from the carrier substrate. The etching mask can comprise e.g. a dielectric, for instance silicon oxide ($SiO_2$) or silicon nitride ($Si_3N_4$), a metal, for instance gold or platinum, a polymer, for instance a photoresist, or a combination thereof. The etching mask can be partially or completely removed after singulation.

According to at least one embodiment of the method, a passivation layer, in particular a polymer passivation layer, is formed on the side flank. In order to change the surface-wettability of the side flank, the passivation layer can be removed in regions in a targeted manner. Furthermore, in order to achieve local, different surface-wettability of the side flank a passivation period during the formation of the passivation layer at different locations of the side flank can be adjusted to be of different duration or subsequently can be partially or completely removed or structured.

The method is particularly suitable for the production of a semiconductor chip described above. Therefore, features stated in conjunction with the semiconductor chip can also be applied to the method, and vice-versa.

Other advantages, preferred embodiments and developments of the optoelectronic semiconductor chip and of the optoelectronic component and of the method are apparent from the exemplified embodiments explained hereinafter in conjunction with FIGS. 1 to 5B. In the Figures.

Figure 1:
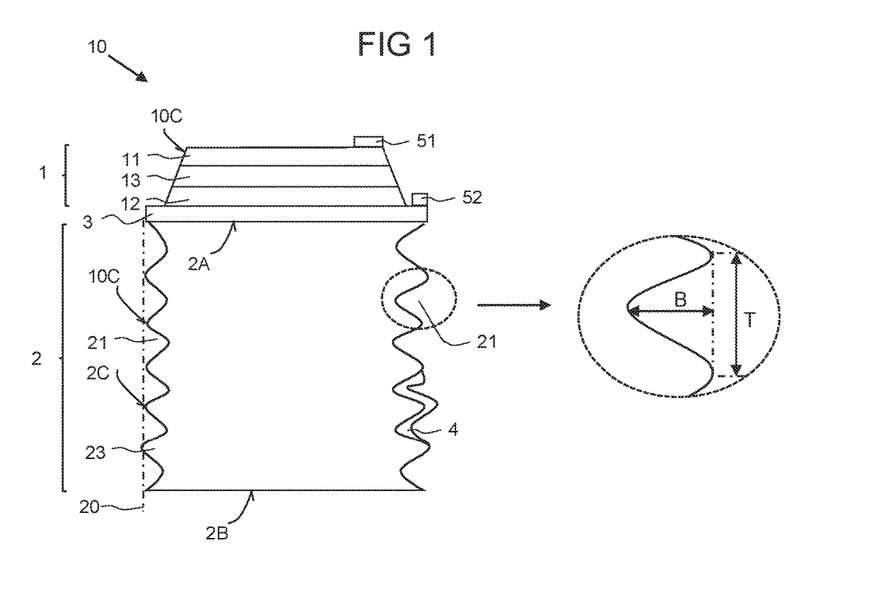
FIG. 1 shows a schematic sectional view of an exemplified embodiment of a semiconductor chip.

A first exemplified embodiment of an optoelectronic semiconductor chips is illustrated in FIG. 1. The semiconductor chip 10 comprises a semiconductor body 1 and a carrier 2. The semiconductor body 1 is arranged on the carrier 2. The semiconductor body 1 comprises a first semiconductor layer 11 of a first charge carrier type, an active layer 13 and a second semiconductor layer 12 of a second charge carrier type. The active layer 13 is provided for generating an electromagnetic radiation and is arranged between the first semiconductor layer 11 and the second semiconductor layer 12. The semiconductor layers 11 and 12 and the active layer 13 can each be formed with one layer or with multiple layers.

The carrier 2 can be different from a growth substrate on which the semiconductor layers of the semiconductor body are epitaxially grown. In particular, the semiconductor chip 10 is free of a growth substrate.

An intermediate layer 3 is arranged between the semiconductor body 1 and the carrier 2. The intermediate layer 3 can contain one or a plurality of layers. For example, the intermediate layer 3 is a connecting layer, for instance an adhesive layer or a solder layer. The intermediate layer 3 can comprise a reflective layer or can be formed to be reflective. The intermediate layer 3 can be formed to be electrically conductive.

In order to electrically contact the semiconductor body, a first contact layer 51 is arranged directly on the first semiconductor layer 11. A second contact layer 52 is arranged laterally of the semiconductor body on the intermediate layer 3. In a deviation therefrom, it is also feasible for the second contact layer 52 to adjoin the second semiconductor layer 12 or for the carrier 2 to be formed to be electrically conductive, so that the semiconductor body 1 can be electrically contacted externally via the first contact layer 51 and via the carrier 2.

The carrier 2 comprises a first major surface 2A facing towards the semiconductor body 1 and a second major surface 2B facing away from the semiconductor body 1. The first major surface 2A and the second major surface 2B define the carrier 2 in the vertical direction. In particular the first and the second major surface are formed in a planar manner and within the scope of the production tolerances do not comprise any elevations or depressions. In FIG. 1, the first and the second major surface are formed in parallel with one another. The cross-sectional areas of these major surfaces are identical or are identical at least within the scope of the production tolerances. The first major surface 2A and the second major surface 2B can each be circular, oval or polygonal, for instance rectangular or square.

The semiconductor chip comprises a lateral surface 10C. The lateral surface 10C contains a lateral surface of the semiconductor body 1 and a side flank 2C of the carrier 2.

The carrier 2 comprises a structured region for enlarging a total surface area of the side flank 2C. The structured region comprises singulating traces. The structured region can be an indentation 21, a projection 23, a barrier groove 22 on the side flank 2C or the entire side flank 2C.

The side flank 2C comprises an indentation 21. The indentation 21 has a lateral width which is e.g. between 0.3 μm and 6 μm inclusive. The indentation 21 has a vertical depth T. The vertical depth T is between 1 μm and 18 μm inclusive. In particular, the lateral width B and the vertical depth T of the indentation 21 are formed in such a manner that the vertical depth T is at least precisely as large as the lateral width B and at the most 5 times as large as the lateral width B.

The side flank 2C comprises a plurality of indentations 21 which are spaced apart from one another in the vertical direction. In particular, the indentation 21 or the plurality of indentations 21 is completely circumferential with respect to the carrier 2 and thus the semiconductor chip in the lateral direction. The indentation 21 is thus formed as a depression which is circumferential with respect to the semiconductor chip 10.

The side flank 2C of the carrier 2 comprises a plurality of projections 23. One indentation 21 is arranged in each case between two adjacent projections 23. In the sectional view, the projections 23 each have a position of the maximum lateral elevation of the projections 23. In FIG. 1, a connecting line 20 of the positions of the maximum lateral elevations of the projections 23 is directed perpendicularly with respect to the first major surface 2A and with respect to the second major surface 2B. When viewed globally or macroscopically—that is to say with the exception of local fluctuations by reason of the indentations 21 and projections 23—the side flank 2C of the carrier 2 is perpendicular to the major surfaces.

Regions of the side flank 2C are covered by a passivation layer 4. In a deviation therefrom, the passivation layer 4 can completely cover the side flank 2C.

The carrier 2 can be a growth substrate. For example, the carrier 2 is formed to be radiolucent. In a deviation from FIG. 1, the semiconductor chip 10 can be free of an intermediate layer 3. For example, the semiconductor chip 10 is a volume emitter.

Figure 2A:
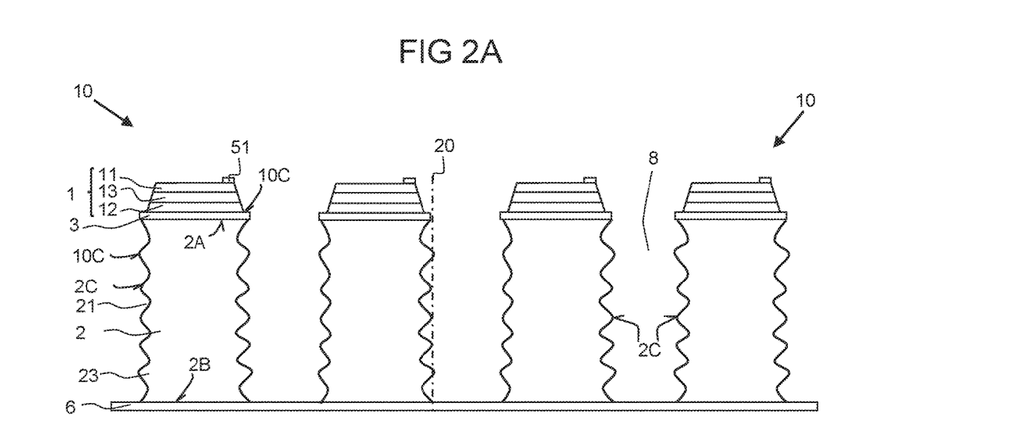
FIGS. 2A to 2E and 3 show schematic sectional views of further exemplified embodiments of an optoelectronic semiconductor chip.

FIG. 2A schematically illustrates a plurality of optoelectronic semiconductor chips 10. The structural configuration of the semiconductor chips illustrated in this exemplified embodiment corresponds to the structural configuration of the semiconductor chip 10 illustrated by way of example in FIG. 1.

In FIG. 2A, the semiconductor chips 10 are arranged on a carrier film 6. Two adjacent semiconductor chips 10 are laterally spaced apart from one another by means of a trench 8. The trench 8 is defined in lateral directions by means of the side flank 2C of the carriers 2 of the adjacent semiconductor chips 10. The side flank 2C comprises in each case a plurality of indentations 21 and projections 23. The semiconductor chips 10 illustrated by way of example in FIG. 2A can be produced from a common composite, in particular by means of the formation of the trenches 8.

Figure 2B:
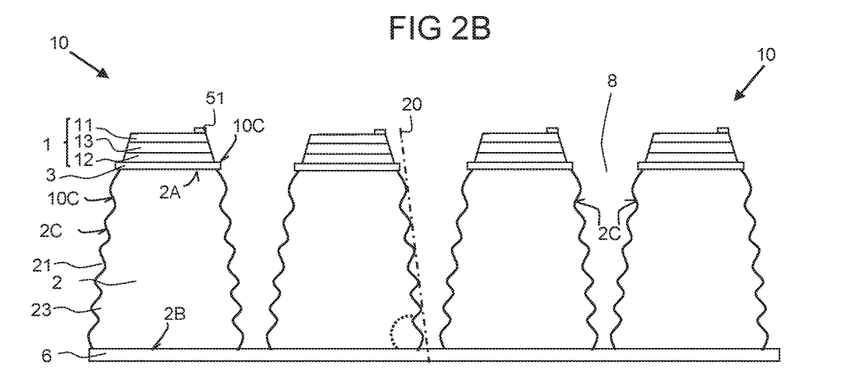

FIG. 2B schematically illustrates a plurality of optoelectronic semiconductor chips 10 in accordance with a further exemplified embodiment. This exemplified embodiment corresponds substantially to the exemplified embodiment in FIG. 2A. In contrast thereto, the connecting line 20 forms an inner acute angle with the second major surface 2B. For example, the acute angle is between 50° and 85° inclusive, preferably between 60° and 85° inclusive and particularly preferably between 70° and 85° inclusive.

As seen in plan view, the first major surface 2A and the second major surface 2B have cross-sections of a different size. The first major surface 2A has a first maximum extent and the second major surface 2B has a second maximum extent, wherein the first maximum extent is smaller than the second maximum extent. The first and the second maximum extent can be an edge length or a diameter of the first major surface 2A or the second major surface 2B. For example, the first maximum extent and the second maximum extent differ from one another by at least 5 times, in particular by at least 20 times or at least 50 times, the lateral width of the indentation 21.

The trench 8 is defined in the lateral direction by the side flank 2C of the carriers 2 of the adjacent semiconductor chips 10, wherein the trench 8 has a lateral cross-section whose area along the vertical direction from the second major surface 2B to the first major surface 2A increases constantly apart from fluctuations caused by the indentations 21 and projections 23. This means that the trench 8, when viewed macroscopically, is formed as a trench which is open from the second major surface 2B towards the first major surface 2A.

Figure 2C:
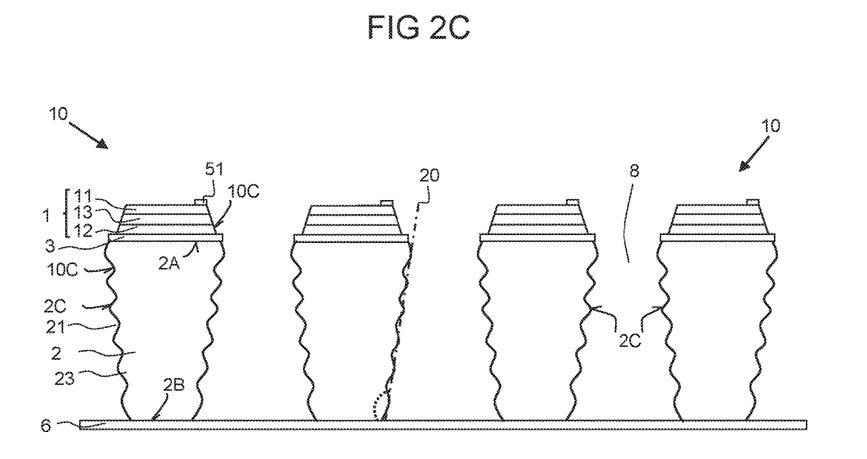

FIG. 2C schematically illustrates a plurality of semiconductor chips 10 in accordance with a further exemplified embodiment. This exemplified embodiment corresponds substantially to the exemplified embodiment in FIG. 2B. In contrast thereto, the connecting line 20 forms an obtuse inner angle with the second major surface 2B. In particular, the obtuse inner angle is at least 95° and at the most 110°, preferably at the most 120° and particularly preferably at the most 130°.

Figure 2D:
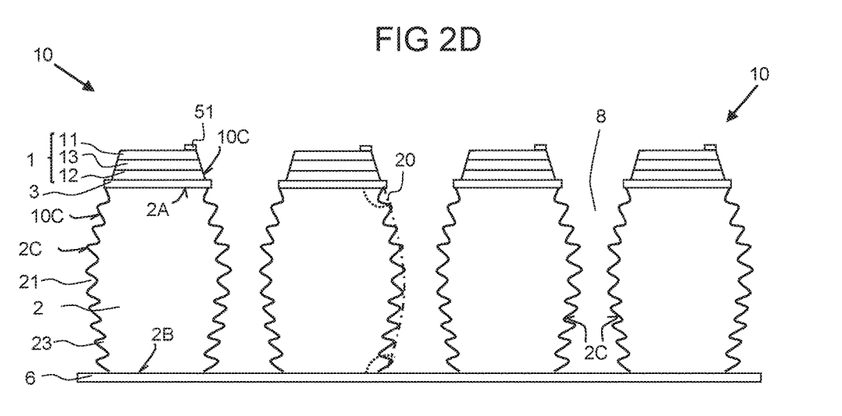

The second maximum extent of the second major surface 2B is smaller than the first maximum extent of the first major surface 2A. For example, the first maximum extent and the second maximum extent differ from one another by at least 5 times, preferably by at least 20 times and particularly preferably by at least 50 times, the lateral width of the indentation 21. The lateral cross-section of the carrier 2 has a constantly growing cross-sectional area from the second major surface 2B towards the first major surface 2A, apart from fluctuations caused by the indentations 21 and projections 23. When viewed macroscopically or globally, the trench 8 is formed as a trench which is open from the first major surface 2A towards the second major surface 2B. FIG. 2D schematically illustrates a plurality of semiconductor chips in accordance with a further exemplified embodiment. This exemplified embodiment corresponds substantially to the exemplified embodiment schematically illustrated in FIG. 2C. In contrast thereto, the connecting line 20 forms an obtuse inner angle both with the first major surface 2A and with the second major surface 2B. When viewed macroscopically or globally, the side flank 2C of the carrier is convexly curved. In other words, the connecting line 20 is globally convexly curved between the first major surface 2A and the second major surface 2B. The first major surface 2A and the second major surface 2B each have e.g. a cross-section having identical cross-sectional areas.

The carrier 2 comprises, at a location between the first major surface 2A and the second major surface 2B, a cross-section having a maximum cross-sectional area of the carrier 2. For example, a maximum lateral extent of this cross-section differs from the first maximum extent of the first major surface 2A or from the second maximum extent of the second major surface 2B by at least 5 times, preferably by at least 20 times and particularly preferably by at least 50 times, the lateral width of the indentation 21. The trench 8 is in the shape of an hourglass. That is to say that the trench 8 is open both towards the first major surface 2A and also towards the second major surface 2B.

Figure 2E:
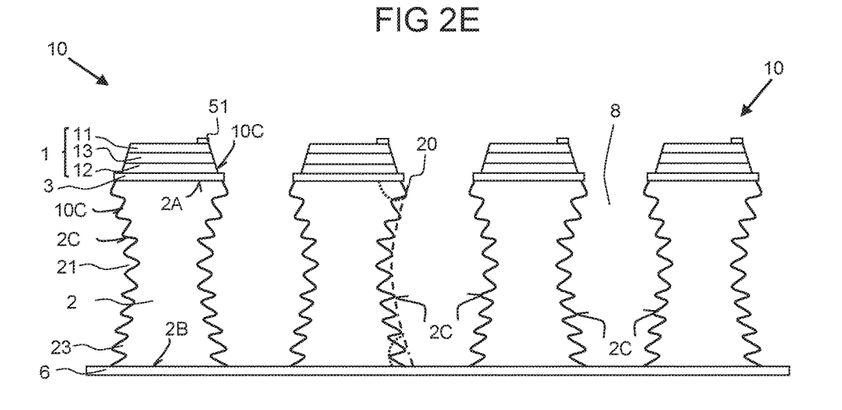

FIG. 2E schematically illustrates a plurality of semiconductor chips in accordance with a further exemplified embodiment. This exemplified embodiment corresponds substantially to the exemplified embodiment schematically illustrated in FIG. 2D. In contrast thereto, the connecting line 20 forms an acute inner angle both with the first major surface 2A and with the second major surface 2B. When viewed macroscopically or globally, the connecting line 20 is formed in a concave manner between the first major surface 2A and the second major surface 2B. In other words, the side flank 2C of the carrier 2, when viewed globally or macroscopically, is concavely curved.

The trench 8 is defined in lateral directions by concavely curved side flanks 2C of the adjacent semiconductor chips 10. The carrier 2 comprises, at a location between the first major surface 2A and the second major surface 2B, a lateral cross-section having a minimum cross-sectional area of the carrier 2. For example, a maximum lateral extent of this cross-section differs from the first maximum extent of the first major surface 2A or from the second maximum extent of the second major surface 2B by at least 5 times, preferably by at least 20 times and particularly preferably by at least 50 times, the lateral width of the indentation 21.

In a deviation from FIGS. 2B to 2E, it is also possible for the trench 8 to be formed in such a manner that within the scope of the production tolerances the side flank 2C is free of the indentations 21 and the projections 23 and the side flank 2C substantially adopts the form of the connecting line 20. When viewed macroscopically, the carrier 2 having such a side flank 2C structured in an oblique or curved manner already comprises an anchoring structure of the semiconductor chip 10 even in the absence of the microscopically structured indentations 21 and projections 23.

Figure 3:
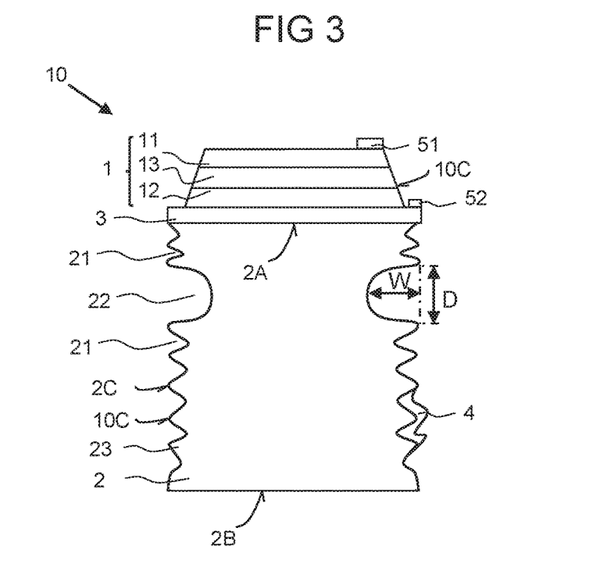

A further exemplified embodiment of an optoelectronic semiconductor chip is schematically illustrated in FIG. 3. This exemplified embodiment corresponds substantially to the exemplified embodiment schematically illustrated in FIG. 1. In contrast thereto, the side flank 2C comprises a barrier groove 22. The barrier groove 22 is arranged between the first major surface 2A and the second major surface 2B and is spaced apart from the major surfaces. A vertical spacing from the barrier groove to the first major surface 2A is smaller than a vertical spacing from the barrier groove 22 to the second major surface 2B. In particular, the barrier groove 22 is circumferential with respect to the semiconductor chip.

The barrier groove has a lateral extent W which in particular is between 3 μm and 60 μm inclusive. For example, the lateral extent W is at least twice and at the most 10 times as large as the lateral width B of the indentation 21. Preferably, the lateral extent W of the barrier groove 22 is at least 3 times and at the most 5 times as large as the lateral width B of the indentation. The barrier groove 22 has a vertical extent D. In particular, the vertical extent D is at least twice and at the most 10 times, e.g. at least 3 times and at the most 5 times as large as the vertical depth T of the indentation 21.

In a deviation from FIG. 3, the side flank 2C of the carrier 2 can comprise a plurality of circumferential barrier grooves 22, wherein the barrier grooves 22 are spaced apart from one another in the vertical direction. In a deviation from FIG. 3, it is also possible for the side flank 2C to be formed to be free of the indentations 21 and the projections 23.

Figure 4A:
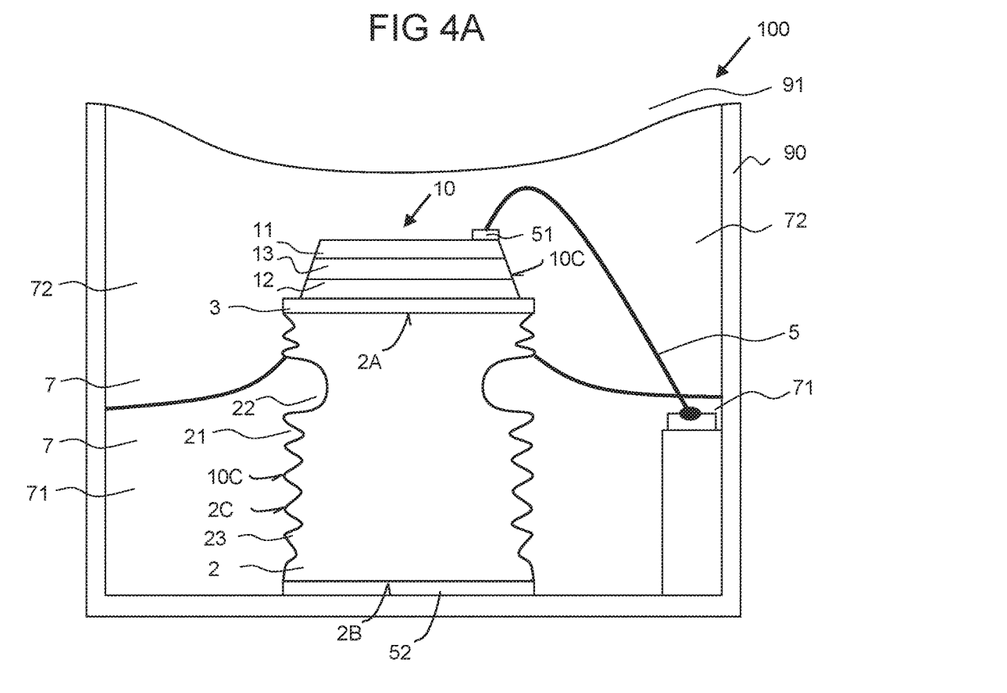
FIGS. 4A and 4B show schematic sectional views of an optoelectronic component.

FIG. 4A schematically illustrates a sectional view of an exemplified embodiment of an optoelectronic device 100.

The optoelectronic component 100 comprises a semiconductor chip 10 and a housing 90. The semiconductor chip 10 illustrated in FIG. 4A corresponds to the semiconductor chip 10 illustrated by way of example in FIG. 3. The housing 90 comprises a cavity 91. The semiconductor chip 10 and a casting compound 7 are arranged in the cavity 91. In a deviation therefrom, a plurality of semiconductor chips 10 can also be arranged in the cavity 91. The casting compound 7 completely surrounds the semiconductor chip in the lateral direction. As seen in plan view, the casting compound 7 completely covers the semiconductor chip 10.

The casting compound 7 engages into the indentations 21 and into the barrier groove 22. The engagement of the casting compound 7 produces a particularly mechanically stable connection between the casting compound 7 and the semiconductor chip 10, whereby a displacement of the semiconductor chip 10 relative to the casting compound 7 is substantially hindered.

The casting compound 7 comprises a first partial layer 71. The partial layer 71 is formed to be reflective. In particular, the partial layer 71 comprises white pigments, for instance titanium oxide particles. The first partial layer 71 surrounds the carrier 2 in the lateral direction. Furthermore, the active layer 13 is free of the first partial layer. The first partial layer is thus formed as a reflector for the radiation generated by the active layer 13. The barrier groove 22 is formed as a boundary barrier for the first partial layer 71. The partial layer 71 fills the cavity 71 at the most as far as including the barrier groove 22.

The barrier groove 22 is spaced apart from the first major surface 2A and from the second major surface 2B. A vertical spacing between the barrier groove 22 and the first major surface 2A is smaller, for instance at least 30% smaller, than a vertical spacing between the barrier groove 22 and the second major surface 2B. An indentation 21 is arranged between the barrier groove 22 and the first major surface 2A. In a deviation therefrom, a plurality of indentations 21 can also be arranged between the barrier groove 22 and the first major surface 2A.

The casting compound 7 comprises a second partial layer 72. The second partial layer 72 is formed to be radiolucent, in particular transparent, for the radiation generated by the active layer 13. For example, the partial layer 72 is a silicone casting compound. The second partial layer 72 completely surrounds the semiconductor body 1 in the lateral direction. As seen in plan view, the second partial layer 72 completely covers the semiconductor chip 10. In the cavity 91, the second partial layer 72 adjoins the first radiation-reflecting partial layer 71.

In order to electrically contact the semiconductor chip 10, a first contact layer 51 is electrically connected to an external electrical current source via a bond wire 5. In FIG. 4A, the semiconductor chip 10 comprises a second contact layer 52 on a side of the semiconductor chip facing towards the second major surface 2B. In particular, the carrier 2 is formed in an electrically conductive manner. The semiconductor chip 10 can thus be electrically contacted externally via the first contact layer 51 and via the second contact layer 52. In a deviation therefrom, it is also feasible that the intermediate layer 3 is formed in an electrically conductive manner and the semiconductor chip 10 can be electrically contacted externally via the first contact layer 51 and via a second contact layer 52 which adjoins the intermediate layer 3.

Figure 4B:
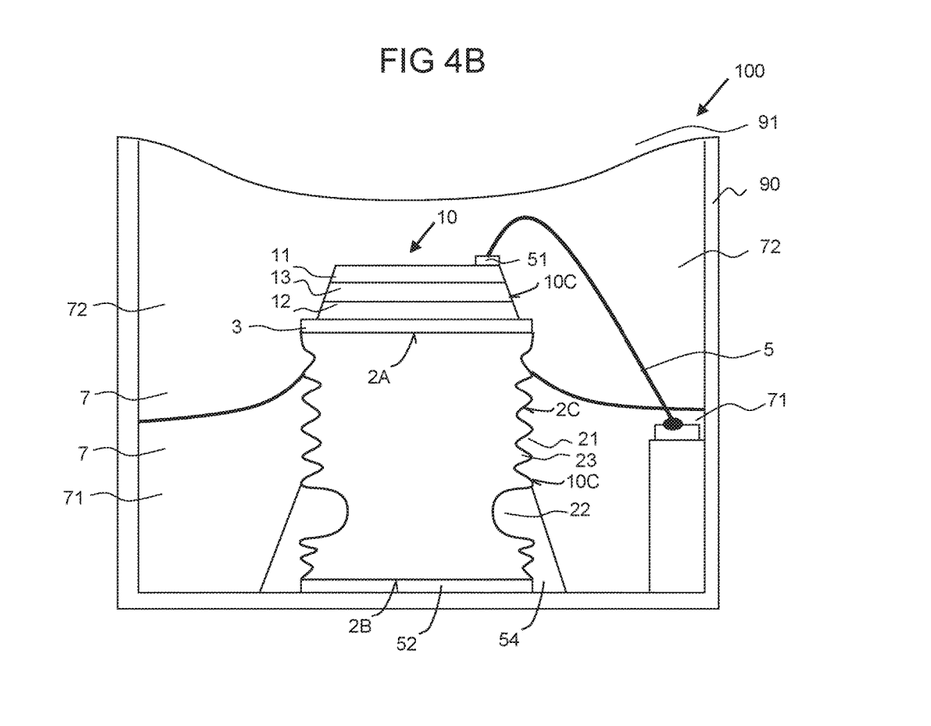

FIG. 4B schematically illustrates a sectional view of a further exemplified embodiment of an optoelectronic component 100. This exemplified embodiment corresponds substantially to the exemplified embodiment schematically illustrated in FIG. 4A. In contrast thereto, the side flank 2C comprises a barrier groove 22, wherein the vertical spacing between the barrier groove 22 and the first major surface 2A is larger, for instance at least 30% larger, than the vertical spacing between the barrier groove 22 and the second major surface 2B. An indentation 21 is arranged between the barrier groove 22 and the second major surface 2B. In a deviation therefrom, a plurality of indentations 21 can also be arranged between the barrier groove 22 and the second major surface 2B.

The component 100 further comprises an attachment layer 54. The attachment layer 54 surrounds the carrier 2 in the lateral direction. The attachment layer 54 engages into the barrier groove 22. The barrier groove 22 is formed as a boundary barrier for the attachment layer 54. The attachment layer 54 partially covers a base surface of the cavity 71. In a deviation therefrom, the attachment layer 54 can completely cover the base surface of the cavity 71. The side flank 2C is covered by the attachment layer 54 between, and including, the barrier groove 22 and the second major surface 2B. The attachment layer 54 thus attaches the semiconductor chip 10 to the base surface of the cavity 71. The attachment layer 54 comprises e.g. an adhesive. In particular, the attachment layer 54 is formed in an electrically conductive manner. In a deviation from FIG. 4B, the side flank 2C can comprise a plurality of barrier grooves 22.

Figure 5A:
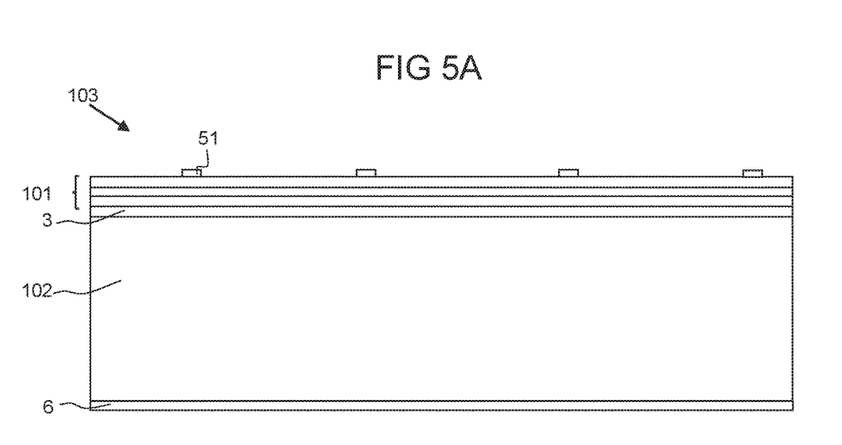
FIGS. 5A and 5B show schematic sectional views of various method stages of an exemplified embodiment of a method for singulating semiconductor chips.
Figure 5B:
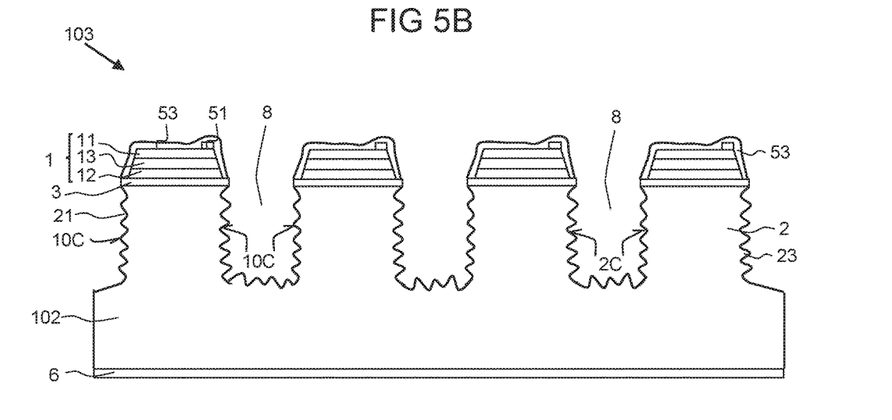

FIGS. 5A and 5B schematically illustrate an exemplified embodiment of a method for singulating a composite 103 into a plurality of optoelectronic semiconductor chips 10.

The composite 103 comprises a semiconductor layer sequence 101 and a carrier substrate 102. The semiconductor layer sequence 101 is arranged on the carrier substrate 102. A connecting layer 3 is arranged between the semiconductor layer sequence 101 and the carrier substrate 102. The composite 103 is arranged on a carrier film 6. The carrier film 6 is formed in particular in a stretchable and elastic manner. However, the arrangement of the composite 103 on a carrier film is optional. A contact layer 51 is applied to the semiconductor layer sequence 101.

FIG. 5B illustrates a plurality of semiconductor bodies 1. The semiconductor bodies 1 come from the common semiconductor layer sequence 101. A plurality of trenches 8 are formed between the semiconductor bodies 1 by means of a singulation method, for instance by means of a plasma singulation method. The trenches 8 extend into the carrier substrate 102. The trenches 8 are formed in such a manner that the trenches 8 are each defined in the lateral direction by a side flank 2C.

An etching mask 53 is applied to a surface of the semiconductor layer sequence facing away from the carrier substrate. The etching mask can be formed by a masking layer which is structured or is applied initially to the entire surface of the semiconductor layer sequence and is then structured. The etching mask can comprise a dielectric, for instance silicon oxide ($SiO_2$) or silicon nitride ($Si_3N_4$), a metal, for instance gold or platinum, or a polymer, for instance a photoresist, or a combination thereof. The etching mask 53 can be partially or completely removed after singulation. Preferably, the etching mask 53 comprises a silicon oxide or a photoresist. Such an etching mask can be applied to the semiconductor layer sequence and structured in a simplified manner. Such an etching mask can also be easily removed after singulation of the semiconductor chips. In a particularly preferred manner, the etching mask comprises a metal and a dielectric or a polymer. The polymer can be completely removed after singulation, wherein the dielectric and the metal can expediently remain on the semiconductor layer sequence. The metal which remains on the semiconductor layer sequence can be used for electrically contacting the singulated semiconductor chips. In particular, the remaining metal forms the first contact layer 51 of the semiconductor chips.

The side flank 2C comprises a plurality of indentations 21. The indentation 21 has a lateral width B which can be in particular between 0.3 μm and 6 μm inclusive. The trenches 8 are formed in such a manner that they extend through the carrier substrate 102, so that the composite 103 is singulated into a plurality of semiconductor chips 10. The singulated semiconductor chips 10 each comprise a semiconductor body 1 having the active layer 13, a carrier 2 consisting of the carrier substrate 102 and the side flank 2C. In a deviation therefrom, the side flank 2C can comprise merely one indentation 21 or merely one barrier groove 22. The side flank 2C can also comprise a plurality of barrier grooves 22.

The trenches 8 can be formed in each case as a trench which is illustrated in FIGS. 2A to 2E.

In order to form the indentation 21, a dry-chemical singulation method, for instance a plasma singulation method, can be applied. The side flank 2C which is structured e.g. by an etching process, for instance by a plasma singulation process, comprises process-typical singulating traces. Such a structured side flank comprises singulating traces and differs clearly from a typical surface roughness which is produced e.g. randomly in a singulation method, for instance by sawing or laser singulation.

The indentation 21 or the barrier groove 22 can be produced during formation of the trench, by varying at least one parameter of the singulation method in a targeted manner. The variation of the at least one parameter can be achieved by means of a controlled change in the gas flows or the etching time in a targeted manner. In order to form the side flanks 2C, a deep reactive ion etching (DRIE) process can be applied. In the case of such a process, sulfur hexafluoride ($SF_6$) can be used as the reaction gas supplier and argon can be used as the carrier gas. In order to form an indentation having a lateral width between 0.3 μm and 6 μm inclusive, an etching time of ca. 15 to 40 seconds is set. In order to form a barrier groove 22, the etching time can be 3 to 5 times as long as the etching time for an indentation. In order to accelerate the etching process, the gas flows can be adjusted accordingly.

By adjusting the gas flows and/or the etching time during different etching phases in a targeted manner, different shapes of the trench 8, for instance as illustrated in FIGS. 2A to 2E, can be formed. The trench 8 is defined in the lateral direction in particular by the structured side flank 2C which typically comprises process-typical singulating traces.

In a deviation from FIGS. 5A and 5B, a passivation layer 4 can be formed on the side flank 2C. In order to form the passivation layer 4, e.g. a gaseous perfluorinated alkene, for instance perfluoroisobutene ($C_4F_8$), or a gas mixture of tetrafluoromethane ($CF_4$) and hydrogen ($H_2$) is used. Argon (Ar) can be used as a carrier gas to accelerate the gas flows. The passivation layer 4 formed on the side flank 2C can be partially or completely removed in order to adjust the local surface-wettability of the side flank 2C.

The composite 103 consisting of the semiconductor body 101 and the carrier substrate 102 can be arranged on a flexible carrier film 6 prior to singulation. The flexible carrier film 6 is formed in a stretchable and elastic manner, whereby the formation of different shapes of the trench 8 can be simplified by virtue of the flexible carrier film 6 being extending by different amounts. Furthermore, the semiconductor chips 10 are present, after singulation, in an ordered manner on the flexible carrier film, whereby further processing of the semiconductor chips 10 in a subsequent process step can be simplified.

The trench 8 can be formed in such a manner that it does not extend in the vertical direction completely to the carrier film 6. The carrier substrate 102 can then be singulated by a mechanical process step, in particular by breaking, into a plurality of carriers 2 of the semiconductor chips 10. Therefore, the carrier film 6 does not necessarily have to be resistant to etching means.

The mechanical stability of an optoelectronic component comprising a semiconductor chip and a casting compound is increased by means of a structured carrier of the semiconductor chip. The structured carrier can comprise an oblique, globally concavely or convexly curved side flank. In addition or alternatively, the side flank can be structured in such a manner as to comprise local indentations. Structuring of the carriers of the semiconductor chips during singulation reduces the cost for producing a plurality of such semiconductor chips.

The description of the invention made with reference to the exemplified embodiments does not restrict the invention to these embodiments. Rather, the invention encompasses any new feature and any combination of features, including in particular any combination of features in the claims, even if this feature or this combination is not itself explicitly indicated in the claims or exemplified embodiments.

The present application claims the priority of German application DE 10 2013 111 503.9, the disclosure content of which is hereby incorporated by reference.

LIST OF REFERENCE NUMERALS 10 optoelectronic semiconductor chip
10C lateral surface of the semiconductor chip
100 optoelectronic component
101 semiconductor layer sequence
102 carrier substrate
103 composite
1 semiconductor body
11 first semiconductor layer
12 second semiconductor layer
13 active layer
2 carrier
2A first major surface of the carrier
2B second major surface of the carrier
2C side flank of the carrier
20 connecting line
21 indentation
22 barrier groove
23 projection
3 intermediate layer
4 passivation layer
5 bond wire
51 first contact layer
52 second contact layer
53 etching mask
54 attachment layer
6 carrier film
7 casting compound
71 first partial layer of the casting compound
72 second partial layer of the casting compound
8 trench
90 housing
91 cavity of the housing
B lateral width of the projection
T vertical depth of the projection
W lateral extent of the barrier groove
D vertical extent of the barrier groove

The invention claimed is:

1. An optoelectronic semiconductor chip having a carrier and a semiconductor body comprising an active layer provided for generating electromagnetic radiation, wherein
the carrier comprises a first major surface facing towards the semiconductor body, a second major surface facing away from the semiconductor body and a side flank arranged between the first major surface and the second major surface,
the carrier comprises a structured region for enlarging a total surface area of the side flank, the structured region comprising singulating traces, the structured region comprises a barrier groove, which is circumferential with respect to the carrier, on the side flank, a lateral extent of the barrier groove is between 3 µm and 60 µm inclusive, the barrier groove is spaced apart from the first major surface and from the second major surface, and the optoelectronic semiconductor chip comprises one of the following additional features (i) and (ii), namely:
(i) the structured region further comprises on the side flank a plurality of indentations and a lateral extent of the barrier groove is at least twice and at the most ten times as large as a lateral extent of the indentations, or
(ii) the structured region comprises an indentation on the side flank, wherein a lateral width of the indentation is between 0.3 µm and 6 µm inclusive and the indentation has a vertical depth which is between 1 times and 5 times the lateral width of the indentation inclusive.

2. The optoelectronic semiconductor chip according to claim 1, wherein the barrier groove is formed as a depression which is completely circumferential with respect to the carrier.

3. The optoelectronic semiconductor chip according to claim 1, wherein the structured region is the entire side flank, wherein the carrier is structured in such a manner that the side flank is globally concavely curved or globally convexly curved in the vertical direction.

4. The optoelectronic semiconductor chip according to claim 1, wherein the structured region is the entire side flank, wherein the carrier is structured in such a manner that as seen in plan view, the first major surface and the second major surface have cross-sections of different sizes, and the side flank forms with the second major surface or with the first major surface an inner acute angle.

5. The optoelectronic semiconductor chip according to claim 1, wherein the structured region comprises a plurality of indentations and/or a plurality of barrier grooves which are completely circumferential with respect to the carrier in the lateral direction and are spaced apart from one another in the vertical direction.

6. An optoelectronic component comprising a semiconductor chip according to claim 1 and a housing, wherein the housing comprises a cavity, in which the semiconductor chip and a casting compound are arranged in such a manner that the casting compound laterally surrounds the semiconductor chip and completely covers it as seen in plan view.

7. An optoelectronic semiconductor chip having a carrier and a semiconductor body comprising an active layer provided for generating electromagnetic radiation, wherein
the carrier comprises a first major surface facing towards the semiconductor body, a second major surface facing away from the semiconductor body and a side flank arranged between the first major surface and the second major surface,
the carrier comprises a structured region for enlarging a total surface area of the side flank, the structured region comprising singulating traces,
the structured region comprises an indentation and a barrier groove, the barrier groove being circumferential with respect to the carrier, on the side flank, and
a lateral extent of the barrier groove is at least twice and at the most 10 times as large as a lateral width of the indentation.

8. The optoelectronic semiconductor chip according to claim 7, wherein
the barrier groove is a circumferential depression being closed in the lateral direction with respect to the carrier, and
the lateral extent of the groove is between 3 µm and 60 µm inclusive.

9. An optoelectronic component comprising a housing and a semiconductor chip, the semiconductor chip having a carrier and a semiconductor body comprising an active layer provided for generating electromagnetic radiation, wherein
the carrier comprises a first major surface facing towards the semiconductor body, a second major surface facing away from the semiconductor body and a side flank arranged between the first major surface and the second major surface,
the carrier comprises a structured region for enlarging a total surface area of the side flank, the structured region comprising singulating traces,
the housing comprises a cavity, in which the semiconductor chip and a casting compound are arranged in such a manner that the casting compound laterally surrounds the semiconductor chip and completely covers it as seen in plan view,
the structured region comprises a barrier groove which is circumferential with respect to the carrier, and
the optoelectronic component comprises one of following features (i) to (iii):
(i) the casting compound comprises a first radiation-reflecting partial layer, the first radiation-reflecting partial layer laterally surrounding the carrier, and the first radiation-reflecting partial layer fills the cavity at the most as far as including the barrier groove,
(ii) the semiconductor chip is attached by means of an attachment layer to a base surface of the cavity, the attachment layer at least partially covers the base surface of the cavity, the attachment layer engages into the barrier groove, and the barrier groove is formed as a boundary barrier for the attachment layer, or
(iii) the barrier groove is spaced apart from the first major surface and from the second major surface, wherein on the side flank, a lateral extent of the barrier groove is between 3 µm and 60 µm inclusive, and the casting compound comprises a first radiation-reflecting partial layer, and wherein the first partial layer laterally surrounds the carrier and, as seen in plan view, the active layer is free of the first partial layer.

* * * * *